United States Patent
Lin

(10) Patent No.: US 9,525,385 B2
(45) Date of Patent: Dec. 20, 2016

(54) DEVICE AND METHOD FOR REDUCING CLIPPING IN AN AMPLIFIER

(71) Applicant: STMicroelectronics (Shenzhen) R&D Co. Ltd, Shenzhen (CN)

(72) Inventor: Hong Wu Lin, Shenzhen (CN)

(73) Assignee: STMICROELECTRONICS (SHENZHEN) R&D CO. LTD, Shenzhen (CN)

( * ) Notice: Subject to any disclaimer, the term of this patent is extended or adjusted under 35 U.S.C. 154(b) by 30 days.

(21) Appl. No.: 14/534,727

(22) Filed: Nov. 6, 2014

(65) Prior Publication Data

US 2015/0214902 A1 Jul. 30, 2015

(30) Foreign Application Priority Data

Jan. 28, 2014 (CN) .......................... 2014 1 0045780

(51) Int. Cl.
| | | |
|---|---|---|
| H03F 3/38 | (2006.01) | |
| H03F 1/32 | (2006.01) | |
| H03F 3/185 | (2006.01) | |
| H03F 3/217 | (2006.01) | |

(52) U.S. Cl.
CPC ............ *H03F 1/3205* (2013.01); *H03F 3/185* (2013.01); *H03F 3/2171* (2013.01); *H03F 3/2173* (2013.01); *H03F 2200/03* (2013.01); *H03F 2200/351* (2013.01); *H03F 2200/66* (2013.01)

(58) Field of Classification Search
CPC ....... H02M 3/158; H03F 3/217; H03F 3/2171; H03F 3/2175; H03K 5/086; H03L 5/00; G05F 1/56

USPC ........ 323/247, 282, 284; 327/307, 308, 312, 327/323, 336; 330/10, 207 A, 251, 85, 86; 381/59, 68, 68.4, 96, 104, 107, 108, 120, 381/121

See application file for complete search history.

(56) References Cited

U.S. PATENT DOCUMENTS

| | | | |
|---|---|---|---|
| 6,320,465 B1 | 11/2001 | Masini et al. | |
| 6,525,604 B2 * | 2/2003 | Eckert ................... | H03F 1/3211 330/2 |
| 2005/0083114 A1 | 4/2005 | Risbo | |
| 2007/0075769 A1 * | 4/2007 | Blon ................... | H03F 3/45183 330/86 |
| 2009/0160551 A1 * | 6/2009 | Chen ...................... | H03F 3/217 330/251 |

(Continued)

FOREIGN PATENT DOCUMENTS

| | | | | |
|---|---|---|---|---|
| JP | EP 1770855 A1 * | 4/2007 | ............. | H03F 3/217 |

*Primary Examiner* — Steven J Mottola
*Assistant Examiner* — Hafizur Rahman
(74) *Attorney, Agent, or Firm* — Gardere Wynne Sewell, LLP

(57) ABSTRACT

Limiting clipping in an amplifier is accomplished in the feedback loop of a class D PWM amplifier that includes an integrator coupled to an input node and configured to generate an integrated input signal such that a comparator may then generate a PWM signal for driving an amplifier output stage based on a comparison to a triangle wave signal. To this end, the amplifier also includes a threshold signal generator for generating high and low voltage thresholds based on the triangle wave signal to be used to engage compensation circuits for limiting the overall amplification. Such compensation circuits may be bipolar junction transistors that are disposed in the feedback loop of the integrator. Thus, the overall bandwidth of the amplifier itself is not affected by adding a limiter circuit aimed at reducing clipping.

20 Claims, 3 Drawing Sheets

(56) References Cited

U.S. PATENT DOCUMENTS

2010/0045356 A1* 2/2010 Berkhout ............... H03F 3/217
327/307

* cited by examiner

DEVICE AND METHOD FOR REDUCING CLIPPING IN AN AMPLIFIER

PRIORITY CLAIM

This application claims priority from Chinese Application for Patent No. 201410045780.1 filed Jan. 28, 2014, the disclosure of which is incorporated by reference.

BACKGROUND

Amplifiers are used in many areas of electronics to increase amplitudes of various signals in ways needed by a circuit. For example, audio electronics employ amplifiers to drive speakers at higher volumes by amplifying an audio input signal. Amplifiers are classified in a number of different classifications, one of which is class D. Class D amplifiers (sometimes called switching amplifiers) generate a variable-duty-cycle square wave representing the desired digital output signal (e.g., an audio output signal to drive a speaker) by digitally integrating a feedback signal in the amplification feedback loop. The switching frequency is typically chosen to be ten or more times the highest frequency of interest in the input signal.

In this manner, a class D amplifier delivers a constantly changing voltage signal to a fixed load (e.g., speaker) as modulated by the integrated feedback signal. However, if the digital integrator becomes saturated due to a high level input signal or an out of control feedback loop, the output signal will become distorted in a manner commonly referred to as "clipping". Output clipping is a problem that may cause the class D amplifier to introduce noise or other distortion into the output audio signal which is not desirable.

SUMMARY

In an embodiment, a circuit comprises: an input node configured to receive an input signal; an amplifier coupled to the input node and configured to generate an amplified input signal on an output node; and a limiter circuit coupled to the amplifier in a feedback loop and configured to limit the amplified signal.

In an embodiment, a class D pulse-width modulated amplifier comprises: an input node configured to receive an analog input signal; an integrator coupled to the input node and configured to generate an integrated input signal on an internal node; a pulse-width modulated signal generator coupled to the internal node and configured to generated a pulse-width modulated signal for driving an amplifier output stage; and a limiter coupled between the input node and the internal node and configured to reduce clipping.

In an embodiment, an integrated circuit comprises: an input node configured to receive an analog input signal; an integrator coupled to the input node and configured to generate an integrated input signal on an internal node; a pulse-width modulated signal generator coupled to the internal node and configured to generated a pulse-width modulated signal for driving an amplifier output stage; and a limiter coupled between the input node and the internal node and configured to reduce clipping.

In an embodiment, a system comprises: a first integrated circuit having: an input node configured to receive an analog input signal; an integrator coupled to the input node and configured to generate an integrated input signal on an internal node; a pulse-width modulated signal generator coupled to the internal node and configured to generated a pulse-width modulated signal for driving an amplifier output stage; and a limiter coupled between the input node and the internal node and configured to reduce clipping; and a second integrated circuit coupled to the first integrated circuit.

In an embodiment, a method comprises: receiving a first signal at a first node; comparing the input signal to a threshold signal; amplifying the input signal; and limiting the amplifying if the input signal exceeds the threshold.

BRIEF DESCRIPTION OF THE DRAWINGS

Aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, the subject matter disclosed herein may be directed to a circuit and method for limiting amplification in an amplifier if an input signal exceeds a high or low threshold. Such limiting may be accomplished in the feedback loop of the class D PWM amplifier. In an embodiment, the circuit may include an input node configured to receive an analog audio input signal. The class D amplifier includes an integrator coupled to the input node and configured to generate an integrated input signal on an internal node such that a comparator coupled to the internal node may then generate a PWM signal for driving an amplifier output stage based on a comparison to a triangle wave signal. To this end, the amplifier also includes a threshold signal generator for generating high and low voltage thresholds based on the triangle wave signal to be used to engage compensation circuits for limiting the overall amplification.

The limiting may be accomplished with one of two compensation circuits configured to be turned on when the triangle wave signal exceeds a high or low threshold. In this manner, at times when the input signal may be too close to the high or low threshold such that clipping may occur, the compensation circuits are engaged to provide a current path in the feedback loop for currents that lead to clipping. Such compensation circuits may be bipolar junction transistors that are disposed in the feedback loop of the integrator. Thus, the overall bandwidth of the amplifier itself is not affected by adding a limiter circuit aimed at reducing clipping. These and other aspects are described below with respect to FIGS. 1-5.

Figure 1:
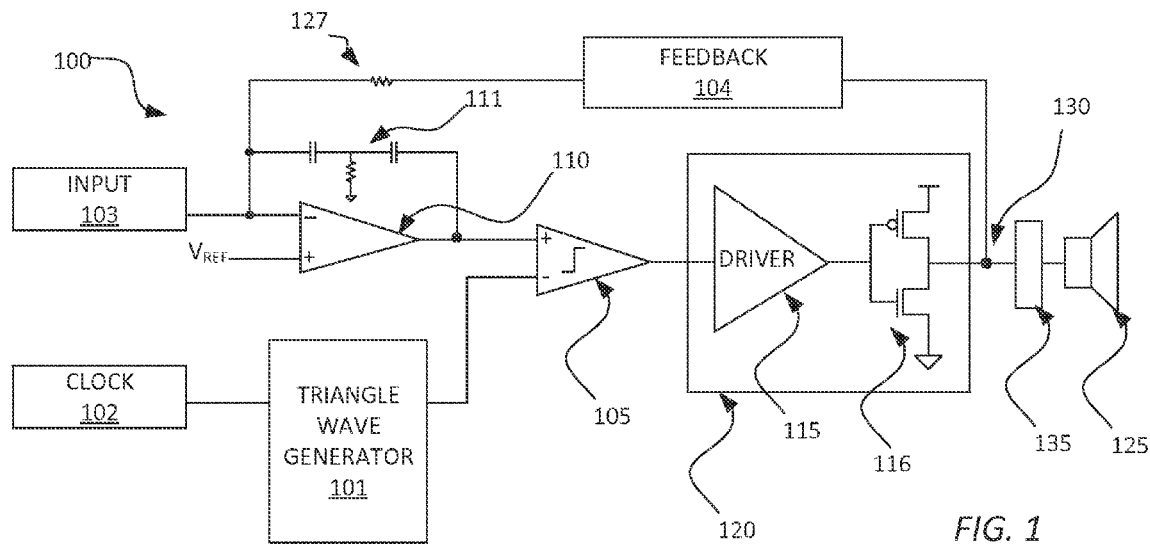
FIG. 1 is a circuit diagram of an analog class D amplifier coupled to a speaker.

FIG. 1 is a circuit diagram of a class D amplifier 100 having an output node 130 coupled to a speaker 125. The amplifier 100 is configured to receive an analog input signal at an input node 103 and to generate a pulse-width modulated (PWM) signal corresponding to the input signal such that an output signal is output to the speaker 125 at the output node 130. The input node 103 may typically be an audio input for an analog signal from any number of commonly available audio signal generators (e.g., CD drive, DVD drive, etc.). In the examples throughout this disclosure, an input audio signal and an output audio signal example will be used to illustrate the various working of the circuits shown in the figures.

Thus, an analog audio input signal 103 is coupled to an inverting input of a high-gain operational amplifier 110 (hereinafter "integrator 110") that is coupled in a negative-feedback integrator configuration via a resistor and capacitor feedback branch 111. The non-inverting input of the integrator 110 is coupled to a reference voltage $V_{REF}$. The reference voltage $V_{REF}$ is typically a voltage signal having an amplitude half way between the positive and negative power-supply voltages (not shown) of the amplifier circuit 100. The integrator 110 has an output node 130 and outputs an analog low-pass filtered version of the audio input signal received at the input node 103.

A comparator 105 receives the output signal of the integrator 110 on a first input node and receives a high-frequency triangle wave signal on a second input node. The triangle wave signal is generated from a triangle wave signal generator 101 which is, in turn, generated from a clock signal 102 (from a clock that is not shown in FIG. 1). The triangle wave signal generator 101 generates a triangle wave signal having the same period as the clock signal 102. The peak amplitudes of the triangle wave signal are typically symmetrical about the reference voltage $V_{REF}$ and the amplitude of the triangle wave signal follows changes in the power supply for power noise suppression.

The comparator 105 then compares the signals received at each of its nodes to yield one of two decisions. The comparator 105 is configured to generate a first output signal if the first input node exhibits a higher voltage than the second input and configured to generate a second output signal if the first input exhibits a lower voltage than the second input. For example, the comparator 105 outputs a "+1" logic voltage when the amplitude of the output signal from the integrator 110 is higher than the amplitude of the triangle wave from the triangle wave generator 101, and outputs a "−1" logic voltage when the amplitude of the output signal of the integrator 110 is lower than the amplitude of the triangle wave from the triangle wave generator 101. When the amplitude of the audio input signal 103 is approximately equal to the voltage reference $V_{REF}$, then the duty cycle of the comparator 105 output is 50% as the amplitude of the triangle wave will be above $V_{REF}$ for about half of all comparison times and below $V_{REF}$ for the other half of the comparison times. This will result is an output signal from the comparator 105 that continuously cycles between a high logic voltage and a low logic voltage at pulsed intervals. That is, the comparator generates a series of PWM pulses of which the duty cycle is directly proportional with the instantaneous amplitude of the integrated audio input signal.

The comparator 105 output is coupled to an input of an output stage 120 that includes a driver/buffer circuit 115 (typically a MOS gate driver) which drives a complementary push-pull output stage 116. This produces an amplified replica of the comparator's PWM signal. The amplifier circuit 100 may include an output filter 135 to remove high-frequency switching components of the PWM output signal at the output node 130. The output stage 120 provides a PWM output signal for driving the speaker 125. Further, this output audio signal is also used as a feedback signal in a negative feedback loop 104 to the inverting input of the integrator 110 though a feedback resistor 127. The operation of the class D amplifier 100 of FIG. 1 may be better understood with respect to the timing diagram of various signals as shown in FIG. 2A.

Figure 2A:
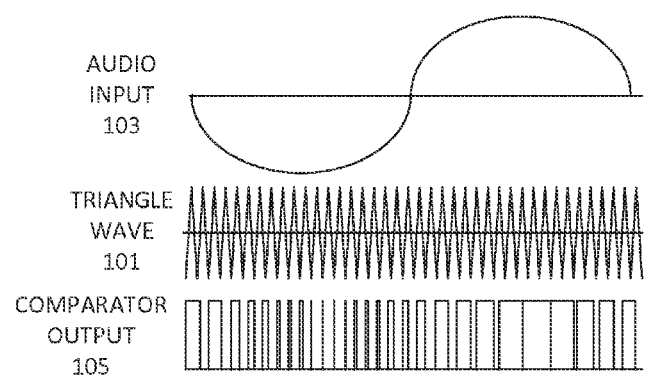
FIG. 2A shows a timing diagram of the class D amplifier of FIG. 1 operating normally.

FIG. 2A shows a timing diagram of the class D amplifier of FIG. 1 operating normally. An audio input signal 103 is shown with a smooth sine wave. This may be representative of a rather small time slice of an overall audio signal. Next, the high-frequency triangle wave from the triangle wave generator 101 is shown. Then, one can see the PWM output signal from the comparator 105 aligned with the characteristics of the audio input signal and the triangle wave. The output signal from the comparator 105 continuously cycles between a high logic voltage and a low logic voltage in a series of PWM pulses of which the duty cycle is directly proportional with the instantaneous amplitude of the audio input signal 103. When the audio input signal is at its lowest amplitude, the duty cycle of the PWM signal is very low with short pulses and when the audio input signal is at its highest amplitude, the duty cycle of the PWM signal is very high with wide pulses.

Figure 2B:
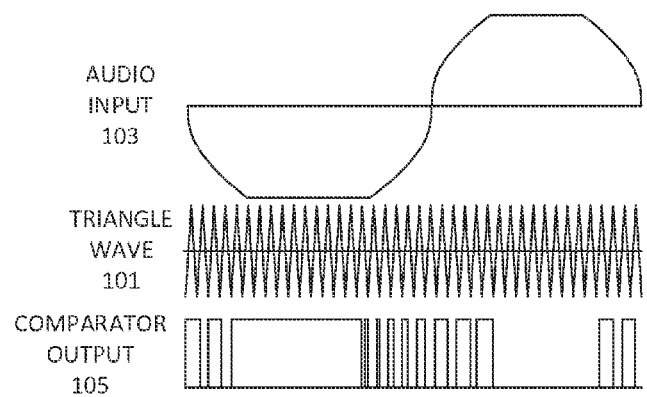
FIG. 2B shows a timing diagram of the class D amplifier of FIG. 1 operating with clipping.

When any amplifier is pushed to create an output signal with more power than an amplifier's power supply can produce, the amplifier will amplify the signal up to its maximum capacity before the signal simply "cuts" or "clips" at the maximum capacity of the amplifier. The portion of the signal which is beyond the capability of the amplifier is simply cut off. This results in a typical sine wave shaped analog audio signal becoming a distorted square-wave-type waveform such that the tops of the sine wave look to have been clipped off. FIG. 2B, described next, shows this phenomenon.

FIG. 2B shows a timing diagram of the class D amplifier of FIG. 1 operating with clipping. Output clipping is a problem that may cause the class D amplifier 100 to introduce noise or other distortion into the output audio signal. In a class D amplifier, clipping occurs when the integrator 110 is overdriven. That is, if the audio input signal 103 or the feedback signal 104 causes the integrator to be saturated, the integrator 110 will be overdriven and lead to clipping. The integrator 110 of FIG. 1 may be overdriven when the amplitude of the signal on its first input node exceeds the maximum amplitude of the triangle wave signal on its second input node.

For example, if the amplitude of the audio input signal 103 goes very low, then this causes the integrator 110 output signal to approximately equal its positive supply rail, and, therefore, to equal the high-peak amplitude of the triangle wave signal. Therefore, even though the amplitude of the audio input signal 103 may be changing, the integrator 110 does not have enough "head room" to follow these changes, and, therefore, effectively "clips" the audio input signal 103. The result of this clipping causes the output of the comparator 105 to stay high until the amplitude of the audio input signal 103 decreases in amplitude enough to lower the integrator 110 output voltage to below the integrator's positive supply rail. A similar phenomenon happens when the audio input signal 103 voltage goes too high and causes the output of the comparator 105 to stay low until the amplitude of the audio input signal 103 decreases enough to increase the integrator 110 output voltage above the negative supply rail. This may be seen in FIG. 2B as the tops of the sine wave of the audio input signal 103 are shown as clipped. Of course, the skilled artisan understands that the actual audio input signal will be unchanged, but that the emulated output signal will resemble that which is depicted in FIG. 2B. Furthermore, clipping can cause the integrator 110 to saturate (i.e., the output drive transistors (not shown) of the integrator 110), and this saturation can cause even more audible noise and distortion in addition to that caused by the clipping of the audio input signal.

One technique for reducing or eliminating clipping is the use of a clip-detection circuit (not shown) that may monitor the output signal of the comparator 105 such that the integrator 110 may be reset when clipping is detected so that the integrator 110 does not saturate or introduce distortion into the eventual output signal. But a problem with this technique is that it introduces another negative feedback loop with the reset signal to the integrator 110, which includes the feed-forward path of the class D amplifier (e.g., the path through the comparator 105 itself). Therefore, the speed at which the clipping-detector circuit can react to, and correct, a clipping event is limited by the bandwidth of the feed-forward portion of the class D amplifier. Therefore, audible noise and distortion, and even integrator 110 saturation, may occur before any clipping-detector circuit is able to detect and correct the clipping.

Figure 3:
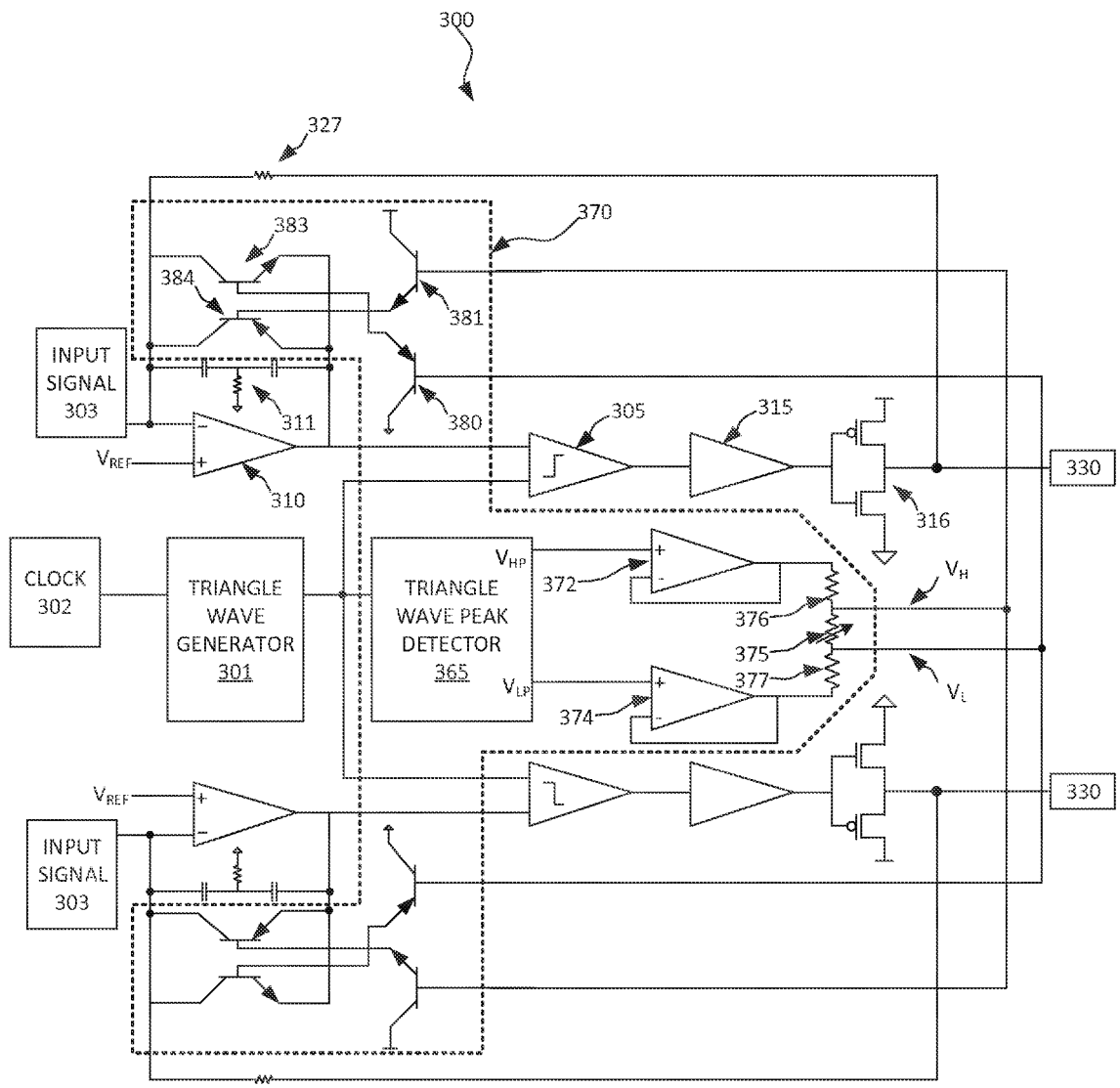
FIG. 3 is a circuit diagram of a class D PWM amplifier with a limiting circuit according to an embodiment of the subject matter disclosed herein.

FIG. 3 is a circuit diagram of a class D PWM amplifier 300 with a limiting circuit 370 according to an embodiment of the subject matter disclosed herein. The limiting circuit includes several electronic components encompassed by the dotted line in FIG. 3. Further, this embodiment shows a differential-input/differential-output class D PWM amplifier 300. It is understood that a single-ended version may also be realized with only the upper portion of FIG. 3. In this respect, the upper and lower portion of the circuit of FIG. 3 operate in a similar manner. As such, focus will be maintained on the upper half of the amplifier 300 for a detailed description of operation.

The limiting circuit 370 utilizes a detection of the high and low voltage thresholds of the triangle wave from the triangle wave generator 301. As before, the triangle wave generator 301 generates a triangle wave from a clock signal from the clock 302. To determine the high and low voltage thresholds of the triangle wave, the limiting circuit 370 includes a triangle peak detector circuit 365. The triangle peak detector 365 is shown and described in greater detail with respect to FIG. 4 below, but for the context of the discussion of the overall limiting circuit 370, the triangle peak detector 365 generates two peak voltage signals $V_{HP}$ and $V_{LP}$. These peak voltage signals $V_H$ and $V_L$ are respectively equal to the positive and negative peaks of the triangle wave signal. Furthermore, the peak voltage signals $V_{HP}$ and $V_{LP}$ are symmetric about the reference voltage $V_{REF}$ (i.e., the peak voltage signal $V_{HP}$ is higher than the voltage reference $V_{REF}$ by an amount equal to how much lower the peak voltage signal $V_{LP}$ is below the voltage reference $V_{REF}$) just as the triangle wave itself is also symmetrical about voltage reference $V_{REF}$.

Thus, the peak voltage signals $V_{HP}$ and $V_{LP}$ may equal the respective high and low peaks of the triangle wave signal initially. The respective output nodes for the peak voltage signals $V_{HP}$ and $V_{LP}$ are coupled to respective non-inverting input nodes of a negative-feedback operational amplifiers 372 and 374. This amplifier stage holds the peak voltage signals $V_{HP}$ and $V_{LP}$ respectively. Then, a resistor network including resistors 375, 376 and 377 may be used to generate threshold voltage signals $V_H$ and $V_L$ to be used with other components of the limiter circuit 370. By varying the resistance of resistor 375, the threshold voltage signals $V_H$ and $V_L$ may be set to any voltage value equal to or below the detected peak voltage signals $V_{HP}$ and $V_{LP}$. Similarly, the threshold voltage signals $V_H$ and $V_L$ also remain symmetrical about the voltage reference $V_{REF}$.

Focus is now turned to only the top portion of FIG. 3. The threshold signals $V_H$ and $V_L$ also then used to control two respective Bipolar Junction Transistors (BJT) used as switches for engaging one of two current compensation circuits. Thus, a node that receives the high voltage threshold $V_H$ is coupled to the base of a PNP BJT transistor 380. This transistor is referred to as the limit PNP transistor 380. Likewise, a node that receives the low voltage threshold $V_L$ is coupled to the base of a NPN BJT transistor 381. This transistor is referred to as the limit NPN transistor 381.

The emitter of the limit PNP transistor 380 is coupled to a base of a first current compensation circuit referred to as a feedback NPN transistor 383. Further, the feedback NPN transistor 383 has its conduction nodes coupled in parallel with the resistor and capacitor feedback branch 311 in the feedback loop of the integrator 310. Likewise, emitter of the limit NPN transistor 381 is coupled to a base of a second current compensation circuit referred to as a feedback PNP transistor 384. As with the feedback NPN transistor 383, the feedback PNP transistor 384 also has its conduction nodes coupled in parallel with the resistor and capacitor feedback branch 311 in the feedback loop of the integrator 310.

By disposing the feedback transistors 383 and 384 in the feedback loop of the integrator 310, the output of the integrator 310 can be exponentially limited as the voltage of the audio input signal 305 approaches the voltage thresholds $V_H$ and $V_L$. This is because the compensation circuits (the feedback transistors 383 and 384) provide a path for current that would otherwise cause clipping in the output signal. The specific operation of these components is described in greater detail next.

During operation, the class D PWM amplifier 300 receives an audio input signal 303. In the case of a single-ended class D PWM amplifier 300, only the top portion of FIG. 3 is part of the overall circuit. As shown in FIG. 3, the audio input signal 303 is a differential audio input signal where the reference numeral 303 designates an input on both the top portion and the bottom portion. Again, since operation of the bottom portion is similar to the top portion, only the top portion will be described in detail for brevity.

As before, the audio input signal 303 is received on a node coupled to an inverting input of the integrator 310 where the non-inverting input of the integrator 310 receives the reference voltage $V_{REF}$. As before, the reference voltage $V_{REF}$ is typically a voltage signal having an amplitude half way between the positive and negative power-supply voltages (not shown) of the amplifier circuit 300. The integrator 310 has an output node and outputs an analog low-pass-filtered version of the audio input signal received at the input node 303.

A comparator 305 receives the output signal of the integrator 310 on a first input node and receives the triangle wave signal on a second input node. The triangle wave signal generator 301 generates a triangle wave signal having the same period as the clock signal 302. The comparator 305 is configured to generate a first output signal if the first input node exhibits a higher voltage than the second input and configured to generate a second output signal if the first input exhibits a lower voltage than the second input. As before, the comparator 305 outputs a "+1" logic voltage when the amplitude of the output signal from the integrator 310 is higher than the amplitude of the triangle wave from the triangle wave generator 301, and outputs a "−1" logic voltage when the amplitude of the output signal of the integrator 310 is lower than the amplitude of the triangle wave from the triangle wave generator 301. This will result is an output signal from the comparator 305 that continuously cycles between a high logic voltage and a low logic voltage at pulsed intervals. That is, the comparator 305 generates a series of PWM pulses of which the duty cycle is directly proportional with the instantaneous amplitude of the integrated audio input signal 303.

The comparator 305 output is coupled to an input of an output stage that includes a driver/buffer circuit 315 (typically a MOS gate driver) which drives a complementary push-pull output stage 316. This produces an audio output signal 330 that is an amplified replica of the comparator's PWM signal. Further, this output audio signal 330 is also used as a feedback signal in a negative feedback loop to the inverting input of the integrator 310 though a feedback resistor 327.

When the amplitude of the audio input signal 303 is such that the amplitude of the output signal of the integrator 310 is between the threshold voltage signals $V_H$ and $V_L$, the feedback NPN and PNP transistors 383 and 384 do not conduct a current or conduct only a negligible amount of current. But when the amplitude of the audio input signal 303 is such that the amplitude of output signal of the integrator 310 approaches the high voltage threshold $V_H$, the feedback PNP transistor 384 effectively limits the amplitude of the output signal of the integrator 310 to the high voltage threshold $V_H$. This is because of the exponential relationship between the collector current and the base-to-emitter voltage Vbe of the feedback PNP transistor 384, a very small change in the amplitude of the output signal of the integrator 310 will cause the feedback PNP transistor 384 to source all of the excess (clipping) current drawn by the audio input signal 303 going below an input clipping threshold. Therefore, this effectively softens the limit from a hard and flat limit to a softer and rounded limit.

More specifically, it is known that for a PNP transistor, such as the feedback PNP transistor 384:

$$Ic \approx -Is * e^{(-Vbe/VT)},$$

where Ic is the collector current, Is is the transistor saturation current, Vbe is the base-emitter voltage (Vbe has a negative value for a PNP transistor), and $V_T$ is the thermal voltage.

Therefore, the voltage of the output signal (labeled $A_O$ hereinafter) of the integrator 310 plus the base-emitter voltage Vbe of the feedback PNP transistor 384 plus he base-emitter voltage Vbe of the limit NPN transistor 381 will equal the high voltage threshold signal $V_H$. Put another way, $V_{BEfeedbackPNP}$ is equal to $V_H - V_{BELimitNPN} - Ao$ Consequently, in terms of current signals, this yields:

$$Ic_{Feedback\_PNP} \approx -Is_{Feedback\_PNP} * e^{(-(VH-Vbe_{Limit\_NPN}-A_o)/VT)}$$

Because the high voltage threshold $V_H$ and base-emitter voltage $V_{belimitNPN}$ of the limit NPN transistor 381 are approximately constant, one can see that even small changes in the output voltage signal Ao of the integrator 310 result in large changes in the collector current $I_{CFeedbackPNP}$ of the feedback PNP transistor 384. As stated above, a change in the amplitude of the output signal of the integrator 310 will cause the feedback PNP transistor 384 to source all of the excess (clipping) current drawn by the audio input signal 303 going below an input clipping threshold. Therefore, this effectively softens the limit from a hard and flat limit as shown in FIG. 2B (exhibiting clipping) to a softer and rounded limit as shown in FIG. 4.

Figure 4:
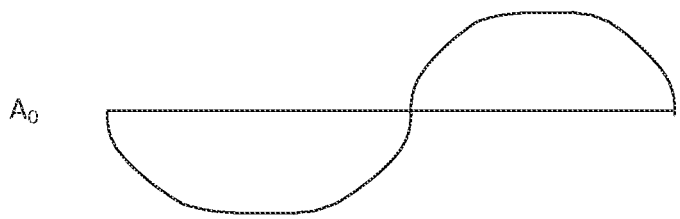
FIG. 4 shows a timing diagram of the class D amplifier of FIG. 3 operating with a limiter circuit according to an embodiment of the subject matter discussed herein.

FIG. 4 shows a timing diagram of the class D amplifier of FIG. 3 operating with a limiter circuit according to an embodiment of the subject matter discussed herein. With a softened limit on Ao, as shown in FIG. 4, the Ao signal does not have a flat, clipped peak, but instead has a rounded peak. Thus, the signal Ao will never quite equal the peaks of the triangle wave signal 301 (even if $V_H$ and $V_L$ are equal to the peaks of the triangle wave signal 301), so that the output of the comparator 305 will not stay high or low for more than one cycle of the triangle wave signal. 301. This may be seen at the comparator 305 output signal still having pulses during the peak portions of $A_O$. Within the context of FIG. 4, these pulse may be exaggerated to illustrate the difference from FIG. 2B and mat not necessarily align with the triangle wave signal 301.

In a similar manner, when the amplitude of the audio input signal 303 is such that the amplitude of output signal of the integrator 310 approaches the low voltage threshold $V_L$, the feedback NPN transistor 383 effectively limits the amplitude of the output signal of the integrator 310 to the low voltage threshold $V_L$.

Furthermore, because of the exponential relationship between the collector current and the base-to-emitter voltage Vbe of the feedback NPN transistor 383, a very small change in the amplitude of the output signal of the integrator 310 will cause the feedback NPN transistor 383 to source all of the excess (clipping) current drawn by the audio input signal 303 going above an input clipping threshold. As before, this effectively softens the limit from a hard and flat limit to a softer and rounded limit.

More specifically, it is known that for a NPN transistor, such as the feedback NPN transistor 383:

$$Ic \approx Is * e^{(Vbe/VT)}$$

$$Ic \approx -Is * e^{(-Vbe/VT)},$$

where Ic is the collector current, Is is the transistor saturation current, Vbe is the base-emitter voltage (Vbe has a positive value for a NPN transistor), and $V_T$ is the thermal voltage.

Therefore, the voltage of the output signal $A_O$ of the integrator 310 plus the base-emitter voltage Vbe of the feedback NPN transistor 383 plus he base-emitter voltage Vbe of the limit PNP transistor 380 will equal the low voltage threshold signal $V_L$. Put another way, $V_{BEfeedbackNPN}$ is equal to $V_L + V_{BElimitPNP} - Ao$.

Consequently, in terms of current signals, this yields:

$$Ic_{feedback\_NPN} \approx Is_{feedback\_NPN} * e^{(VL+VbelimitPNP-Ao)/VT}$$

Because the high voltage threshold $V_L$ and base-emitter voltage $V_{beLimitPNP}$ of the limit PNP transistor 380 are approximately constant, one can see that even small changes in the output voltage signal Ao of the integrator 310 result in large changes in the collector current $Ic_{FeedbackNPN}$ of the feedback NPN transistor 383. As stated above, a change in the amplitude of the output signal of the integrator 310 will cause the feedback NPN transistor 383 to source all of the excess (clipping) current drawn by the audio input signal 303 going above an input clipping threshold. Therefore, this effectively softens the limit from a hard and flat limit as shown in FIG. 2B (exhibiting clipping) to a softer and rounded limit as shown in FIG. 4.

As described above, an embodiment of the invention has advantages over conventional class D PWM amplifiers and methods of operation thereof. For example, the limiter circuit 370 is part of the feedback circuitry of the integrator 305, so it is not limited by the bandwidth of the other portions of the class D PWM amplifier 300. Therefore, the limiter circuit 370 can react more quickly to a clipping event, and even prevent clipping and the audible noise and distortion that clipping may introduce.

Further, limiter circuit 370 may also be used to control the output power of the class D PWM amplifier 300. This may be controlled by adjusting the threshold voltage signals $V_H$ and $V_L$ to adjust the power of the PWM output signal that drives a load, such as a speaker (not shown). That is, one can adjust the speaker volume by adjusting $V_H$ and $V_L$ instead of, or in addition to, adjusting the amplitude of the audio input signal 303.

Figure 5:
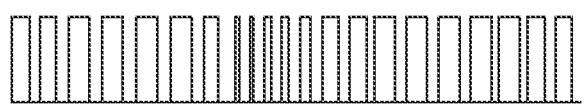
FIG. 5 is a block diagram of a system that includes the class D PWM amplifier of FIG. 3 according to an embodiment of the subject matter disclosed herein.
Figure 5:
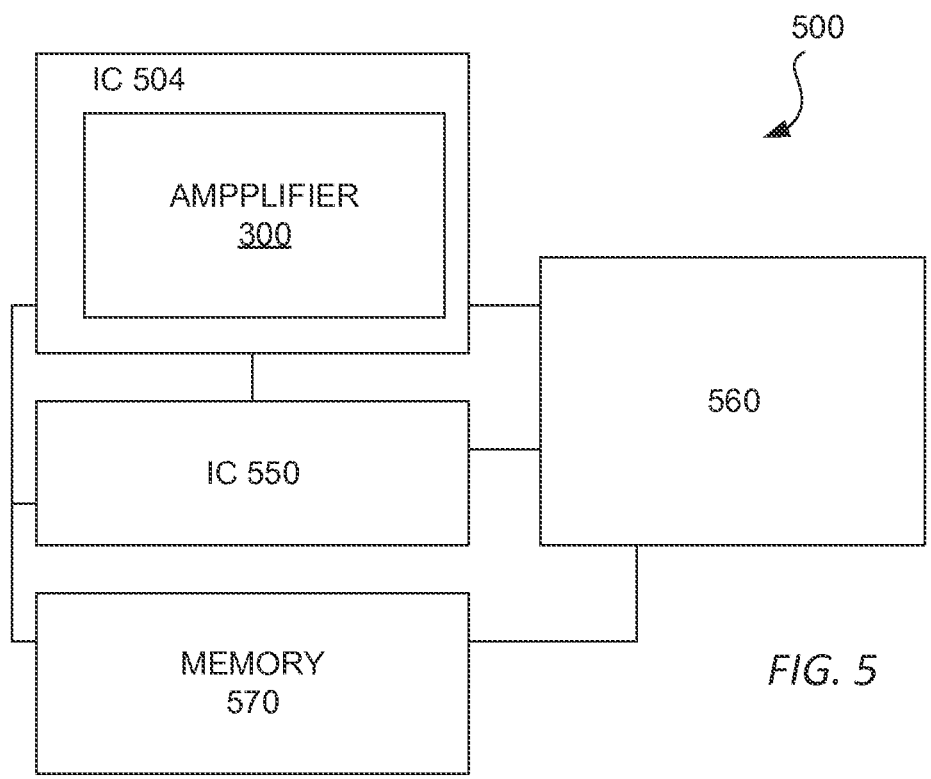

FIG. 5 is a block diagram of a system 500 that includes the class D PWM amplifier of FIG. 3 according to an embodiment of the subject matter disclosed herein. The system 500 may include a first integrated circuit 504 having a class D PWM amplifier 300 as discussed above. The system 500 may further include a second integrated circuit 550 coupled to the first integrated circuit 504. These integrated circuits may be formed on respective integrated circuit dies or may be formed on a single integrated circuit die. Further yet, the integrated circuits 504 and 550 may also be communicatively coupled to a processor 560 and a memory 570, individually or collectively. Each of the additional components may be formed from the same integrated circuit dies as well or may comprise separate integrated circuit dies.

Such a system 500 as shown in FIG. 5 may be any suitable application that may take advantage of class D PWM amplifier 300. One particular example may be low-power signal amplifiers that have limited power available and/or limited die space for an integrated circuit. Thus, the first or second IC 504 and 550 may comprise a amplifier or amplifying circuit configured to amplify a specific signal parameter, such as ambient noise or principle signal such that an amplified digital signal is generated to represent the sensed parameter.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. An amplifier circuit, comprising:
   an input node configured to receive an input signal;
   an integrating amplifier having an integrating amplifier input coupled to the input node and having an integrating amplifier output configured to generate an integrating amplifier output signal;
   an integration feedback loop connecting the integrating amplifier output and the integrating amplifier input; and
   an analog limiter circuit coupled in parallel to the integration feedback loop between the integrating amplifier input and the integrating amplifier output and configured to variably bypass a current around the integration feedback loop in response to a voltage of the integrating amplifier output signal.

2. The amplifier circuit of claim 1, wherein the amplifier circuit further comprises a class D pulse-width modulated amplifier.

3. An amplifier, comprising:
   an input node configured to receive an analog input signal;
   an integrator coupled to the input node and configured to generate an integrator output signal on an internal node;
   a capacitive feedback loop coupling the internal node to the input node; and
   a limiter circuit coupled between the input node and the internal node parallel to the capacitive feedback loop and configured to exponentially limit the integrator output signal by shunting current from the capacitive feedback loop,
   wherein the limiter circuit comprises a first compensation circuit configured to provide a first current path for shunting current in response to the integrator output signal approaching a first voltage threshold.

4. The amplifier of claim 3, wherein the limiter circuit further comprises a second compensation circuit configured to provide a second current path for shunting current in response to the integrator output signal approaching a second voltage threshold.

5. The amplifier of claim 4, wherein the first compensation circuit comprises an NPN bipolar junction transistor coupled between the internal node and the input node, and wherein the second compensation circuit comprises a PNP bipolar junction transistor coupled between the internal node and the input node.

6. A circuit comprising:
   an input node configured to receive an analog input signal;
   an integrator coupled to the input node and configured to generate an analog integrator output signal on an internal node; and
   a limiter coupled between the input node and the internal node and comprising a path to bypass a current around the integrator and exponentially limit the analog integrator output signal to reduce clipping of the analog integrator output signal;
   wherein a magnitude of the current is dependent on a potential difference between the analog integrator output signal and a threshold voltage.

7. The circuit of claim 6, wherein the input node comprises a differential input node.

8. The amplifier circuit of claim 1, wherein the analog limiter circuit comprises a transistor comprising a first conduction node connected to the integrating amplifier input and a second conduction node connected to the integrating amplifier output, wherein a conduction path between the first conduction node and the second conduction node is parallel to the integration feedback loop.

9. The amplifier circuit of claim 1, wherein a magnitude of the current varies exponentially in response to a linear variation in a difference between a threshold voltage and the voltage of the integrating amplifier output signal.

10. The amplifier circuit according to claim 8, wherein the transistor further comprises a control node configured to receive a control signal,
   wherein the analog limiter circuit further comprises a first limit transistor configured to generate the control signal in response to a fixed reference voltage derived from a peak voltage of a triangle wave, and wherein the transistor varies a resistance of the conduction path in response to a difference between a voltage of the control signal on the control node and the voltage of the integrating amplifier output signal.

11. The amplifier circuit of claim 8, wherein the transistor further comprises a control node receiving a threshold voltage, wherein the transistor varies a resistance of the conduction path in response to a difference between the threshold voltage and the voltage of the integrating amplifier output signal.

12. The amplifier circuit of claim 11, wherein the transistor comprises a bipolar junction transistor, the first conduction node comprises a collector, the second conduction node comprises an emitter, and the control node comprises a base.

13. The amplifier circuit of claim 11, wherein the analog limiter circuit further comprises a first limit transistor for biasing the control node.

14. The amplifier circuit of claim 13, wherein the analog limiter circuit further comprises a resistor network configured to adjust the first limit transistor whereby the threshold voltage is adjusted.

15. The amplifier circuit of claim 1, wherein the analog limiter circuit exponentially varies the current bypassed around the integration feedback loop in response to a linear change in the voltage of the integrating amplifier output signal.

16. The amplifier circuit of claim 1, wherein the analog limiter circuit comprises:
a first current compensation circuit comprising:
a first variable conductance path connected in parallel to the integration feedback loop and configured to variably bypass the current around the integration feedback loop; and
a first limit transistor configured to control a variable conductance of the first variable conductance path.

17. The amplifier circuit of claim 16, wherein the limit transistor comprises an NPN transistor having a base connected to a high voltage threshold approximately equal to a peak of a triangular wave generated from a clock signal.

18. The amplifier circuit of claim 16, wherein the variable conductance path comprises a collector-emitter path of a PNP bipolar junction transistor.

19. The amplifier circuit of claim 16, further comprising:
a second current compensation circuit comprising:
a second variable conductance path connected in parallel to the integration feedback loop and in parallel to the first variable conductance path and configured to variably bypass the current around the integration feedback loop;
a second limit transistor configured to control a variable conductance of the second variable conductance path,
wherein the first current compensation circuit limits the integrating amplifier output signal to less than a high voltage threshold, and
wherein the second current compensation circuit limits the integrating amplifier output signal to more than a low voltage threshold.

20. The amplifier circuit of claim 17, wherein the first current compensation circuit exponentially limits the integrating amplifier output signal to less than the high voltage threshold.

* * * * *